(12) United States Patent
Bauer

(10) Patent No.: US 7,751,251 B2
(45) Date of Patent: Jul. 6, 2010

(54) CURRENT SENSING SCHEME FOR NON-VOLATILE MEMORY

(75) Inventor: Mark Bauer, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 78 days.

(21) Appl. No.: 12/183,972

(22) Filed: Jul. 31, 2008

(65) Prior Publication Data

US 2010/0027349 A1   Feb. 4, 2010

(51) Int. Cl.
    *G11C 11/34* (2006.01)
(52) U.S. Cl. .............................. 365/185.21; 365/185.24
(58) Field of Classification Search ............ 365/185.21, 365/185.24
    See application file for complete search history.

(56) References Cited

U.S. PATENT DOCUMENTS

| | | | |
|---|---|---|---|
| 5,508,958 A | 4/1996 | Fazio | |
| 6,570,789 B2 | 5/2003 | Trivedi | |
| 7,227,790 B2 * | 6/2007 | Nam et al. | 365/189.07 |
| 7,321,509 B2 * | 1/2008 | Chen et al. | 365/185.03 |
| 7,327,619 B2 * | 2/2008 | Chan et al. | 365/205 |
| 7,345,934 B2 * | 3/2008 | Guterman et al. | 365/200 |
| 7,352,618 B2 * | 4/2008 | Kim et al. | 365/185.02 |
| 7,369,450 B2 * | 5/2008 | Choy | 365/205 |

* cited by examiner

*Primary Examiner*—Michael T Tran
(74) *Attorney, Agent, or Firm*—Cool Patent, P.C.; Joseph P. Curtin

(57) ABSTRACT

A current sensing scheme for non-volatile memory is disclosed comprising an apparatus for determining one or more memory cell states in a non-volatile memory device. The apparatus having a first memory cell coupled to a first bitline and a first sensing element coupled to the first bitline, the first sensing element operable to sense a voltage corresponding to a state of the memory cell wherein the sensed voltage is independent of a bitline voltage discharge over time of the first memory cell.

19 Claims, 3 Drawing Sheets

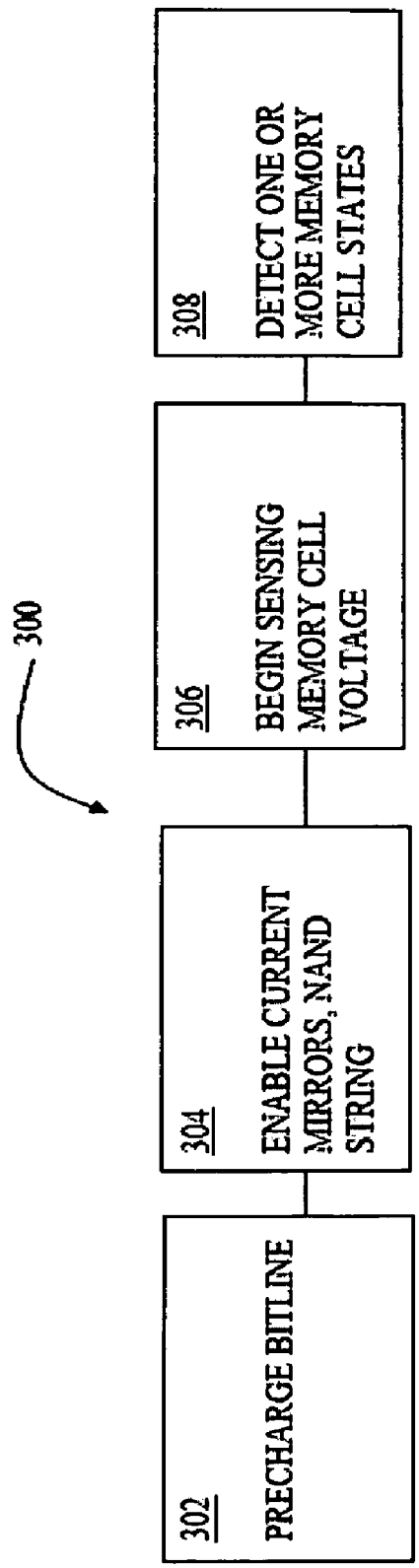

CURRENT SENSING SCHEME FOR NON-VOLATILE MEMORY

BACKGROUND

Technical Field

The disclosure relates to non-volatile memory, more specifically the disclosure relates to sensing.

BRIEF DESCRIPTION OF THE DRAWINGS

FIG. 3 illustrates a particular embodiment of a process for sensing one or more states of a memory cell.

DETAILED DESCRIPTION

In the following detailed description, numerous specific details are set forth in order to provide a thorough understanding of claimed subject matter. However, it will be understood by those skilled in the art that claimed subject matter may be practiced without these specific details. In other instances, well-known methods, procedures, and components have not been described in detail so as not to obscure claimed subject matter.

Throughout the following disclosure the term 'NAND' is used and is intended to refer to the logic function 'not-AND'. The term 'NAND flash' is used throughout the disclosure and is intended to refer to a flash type Electrically Erasable Programmable Read-Only Memory, (EEPROM) device that employs tunnel injection for writing and tunnel release for erasing.

Particular embodiments described herein refer to NAND Flash EEPROM memory devices, however, in other embodiments the following disclosed device and method may be used in a variety of memory devices known to those of ordinary skill in the art and claimed subject matter is not so limited.

Conventional NAND Flash sensing schemes are dynamic in nature in that the sensing signal is the amount of bitline voltage discharge by the memory cell over a predetermined amount of time. To first order, it follows the relationship: I=Cdv/dt in which I is the cell current, C is the fixed bitline capacitance and dv/dt is the amount of bitline voltage discharge vs. time. For example, if a cell current is defined by I=100 nA=trip current, then the sense amplifier will flip when I can discharge C a predetermined voltage over a predetermined time (dv/dt). This scheme is well suited for array architectures in which every-other bitline is grounded, supplying a shield between bitlines being sensed. On advanced technologies, about 90% of the total bitline capacitance is between bitlines (Cb1_b1). Furthermore, cell currents degrade as the cell scales for each lithography generation and capacitance is roughly fixed. Therefore, either dt needs to increase to maintain the same dv or dv must decrease to maintain dt. An increase in dt increases overall sense performance. To maintain sense performance, dv must decrease proportionally to the reduced cell current. In other words, as the cell current scales, to maintain the same sense time, the voltage differential dv, must be reduced, reducing the overall sense signal.

Figure 1:
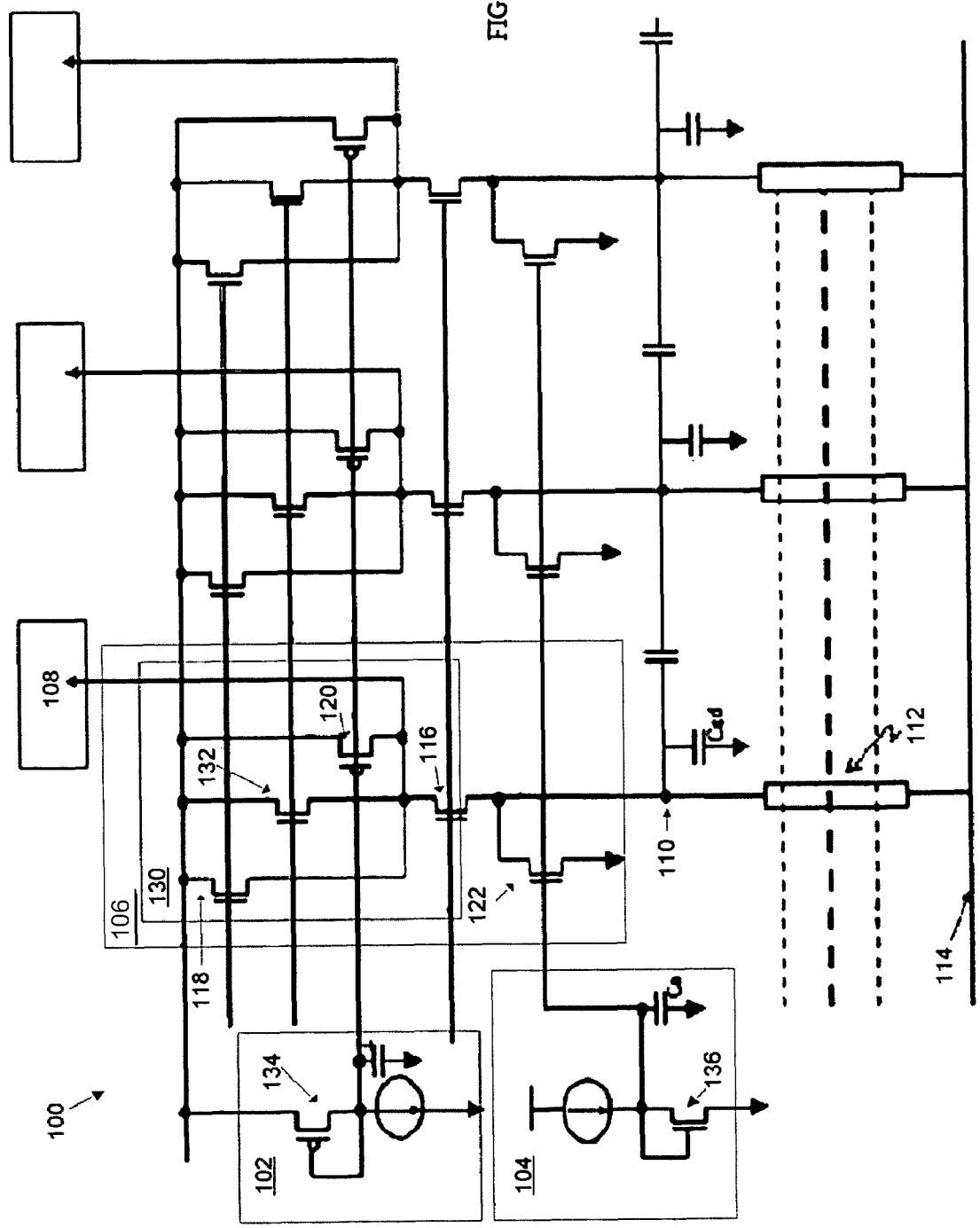
FIG. 1 illustrates a particular embodiment of a sensing element operable to determine one or more states of a memory cell.

FIG. 1 illustrates a particular embodiment of sensing element 100 operable to determine one or more states of a memory cell 130. Such memory cell states may comprise any number of a variety of states, such as, for instance, binary 2 to n states in which n may be any value and/or non-binary bits/cell such as 1.5 and 2.5 and claimed subject matter is not limited in this regard.

In a particular embodiment, a signal sensed by sensing element 100 may be independent of a bitline voltage during sensing. Additionally, sensing element 100 may enable a substantially stable bitline voltage, independent of a memory cell current while a memory cell is being sensed. According to a particular embodiment, a stable bitline voltage during sensing may provide protection against bitline-to-bitline capacitive coupling. Such protection from bitline-to-bitline capacitive coupling may enable sensing of adjacent memory cells during the same sensing period. Further, in another particular embodiment, a stable bitline voltage during sensing may enable more reliable multi-bit sensing in a single memory cell. Where bitline voltages remain substantially constant during a sense phase, a shield bitline array architecture may not be needed and cells on adjacent bitlines may be sensed during a single sense phase.

In a particular embodiment, sensing element 100 may comprise; first reference current circuit 102, second reference current circuit 104 coupled to sensing circuit 106. In a particular embodiment, sensing circuit 106 may be further coupled to sense latch 108. Sensing circuit 106 may be operable to detect a signal corresponding to one or more states of a memory cell 130 to be read from array source 114. Sensing circuit 106 may be coupled to bitline 110 of memory cell 130.

According to a particular embodiment, NAND string 112 may be coupled to and extend from memory cell array source 114. In a particular embodiment, NAND string 112 may consist of a plurality of memory cells connected in series in which a top memory cell of NAND string 112 may be connected to a metal oxide semiconductor (MOS) transistor select device (top select device) and a bottom memory cell of NAND string 112 may be connected to a second MOS transistor select device (bottom select device). According to a particular embodiment, NAND string 112 may be coupled to bitline 110 through a top select device and coupled to a memory cell array source 114 through a bottom select device. According to a particular embodiment, if NAND string 112 is selected, it may couple memory array bitline 110 to source 114. A gate of a selected NAND cell in NAND string 112 may be coupled to a predetermined voltage. In a particular embodiment, if top and bottom select devices are selected, all the deselected cells in NAND string 112 may have a gate voltage applied that is at a higher voltage than the highest threshold voltage (Vt) to be programmed in any cell. Thus, the deselected cells in NAND string 112 may act like switches in the on state. When a memory cell within a string is selected, and a bias is applied, the selected memory may conduct current greater than the trip current when the cell Vt is less than the select cell gate voltage and a current less than the trip current when the threshold voltage of the selected cell is greater than the select cell gate voltage.

In a particular embodiment, during a precharge period prior to a sensing operation, bitline 110 may be precharged a predetermined amount. In a particular embodiment, an amount of precharging may be determined by a variety of factors such as for instance bitline material and design or other technology attributes and claimed subject matter is not limited in this regard. Such a precharge may be driven by precharge device M1 118 through device M4 116. According to a particular embodiment, M4 116 may act as a cascade or cascode device and may charge and hold bitline 110 to a pre-determined voltage. In a particular embodiment, M4 116 and M1 118 may be transistors or other appropriate devices as may be determined by one skilled in the art and claimed subject matter is not limited in this regard.

In a particular embodiment, during a time period corresponding to a bitline precharge period, current mirrors M3 120 and M5 122 may be enabled. M3 120 may mirror a current from first reference current circuit 102 and M5 122 may mirror a current from second reference current circuit 104. In a particular embodiment, first current reference 102 may be a p reference current and reference current 104 may be an n reference current. In a particular embodiment, to inject a current into a node, a p channel device may be used or to remove current from a node, an n channel may be used thus dictating the way the current mirrors and reference current circuits may be constructed. However, these are merely examples of reference circuit arrangements and claimed subject matter is not so limited.

During a time corresponding to a precharge period, NAND string 112 may be enabled to sense when it is selected. In a particular embodiment, select devices may determine such a selection.

In a particular embodiment, a reference current supplied by current mirror M5 122 may insure a direct current (DC) bias to device M4 116 even in the event that there is no current from memory cell 130. Thus, during a sensing period, the output impedance of M4 116 will always be high enough to insure that the voltage on bitline 110 will be a weak function of memory cell 130 current, no matter how low the memory cell current. In other words, during a sense phase, all bitline voltages may remain substantially stable.

In a particular embodiment, when bitline 110 is precharged, precharge device M1 118 may be deactivated and sensing may begin. According to a particular embodiment, sense amplifier circuit 106 may comprise a trip point defined by Icell=Ifref−Isref in which Icell is the current of memory cell 130, Ifref is the current of the first reference current circuit 102 and Isref is the current of the second reference current circuit 104.

In a particular embodiment, Ifref may be selected such that when Icell=Ifref−Isref then Vsen=Vreg/2 where Vreg is a power supply for the sense amplifier to be regulated. In a particular embodiment, the voltage trip point may be defined as the point half way between the power supply and ground.

Figure 2:
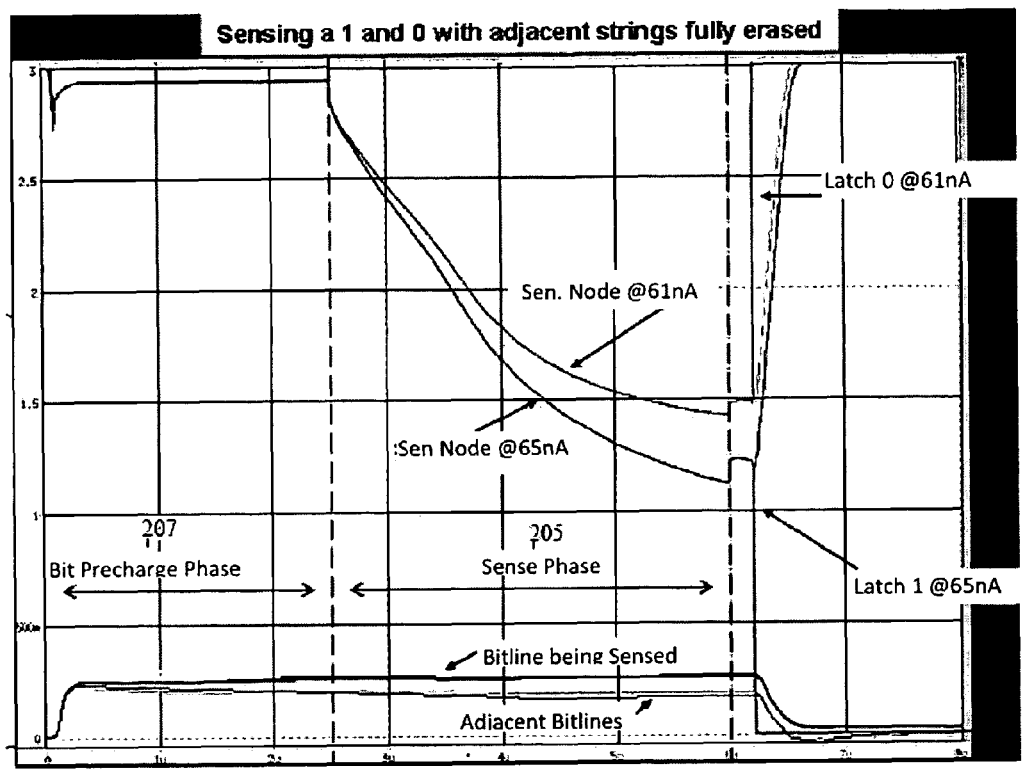
FIG. 2 illustrates a simulation waveform of a particular embodiment of a sensing element during operation.

In a particular embodiment, as M3 120 is acting as a current mirror, M3 120 may have an output impedance such that if Icell is slightly higher than Ifref−Isref, Vsen may swing low. If Icell is slightly lower than Ifref−Isref, Vsen may swing high. According to a particular embodiment, first reference current circuit 102 and M3 120 may have enough output resistance such that if Icell is a few percent higher or lower than Ifref−Isref, a large voltage swing may be achieved on Vsen. For example, see FIG. 2 depicting a simulation waveform wherein the sense latch detects a "1" when Icell=61 na and a "0" when Icell=65 na.

Referring again to FIG. 1, to enable a stable voltage during a sensing period on bitline 110, M2 132 may act as a clamp and signal BLclamp2 may be set about equal to BLclamp1 thus providing that a minimum Vsen voltage is unlikely to be less than a bitline 110 voltage and keeping M4 saturated during the sense phase. Such a stable bitline 110 voltage may prevent a bitline with a full erased NAND string from rapidly swinging bitline 110, causing coupling with an adjacent bitline. In a particular embodiment, when device M4 116 is saturated, it may act as a cascade device and maintain about the same bitline voltage as was set before the sense phase starts.

In a particular embodiment, transistor 134 of first reference current circuit 102 may be matched with M3 132. Transistor 136 of second reference current circuit 104 may be matched with M5 122. In addition, to enabling stability in first reference current circuit 102 and second reference current circuit 104 during a sense phase, these signals may be sampled and held using a sample and hold circuit (not shown) and a capacitor Cp/Cn. In a particular embodiment, a circuit may apply a voltage to Cp, then a switch between the voltage supply and Cp/Cn is open, thus the voltage is held on the capacitor.

As noted above, FIG. 2 depicts a simulation waveform wherein the sense latch detects a "1" when Icell=61 nanoamps and a "0" when Icell=65 nanoamps. Accordingly, any cell current greater than 63 nanoamps may trip the sense amplifier, (referred to herein as a "1") and any cell current less than 63 nanoamps will not trip the sense amplifier, (referred to herein as "0"). In FIG. 2, x-axis 201 represents microseconds and y-axis 203 represents volts. A sense phase 205 is approximately 3.5 microseconds, however this is merely an example based on a particular embodiment and claimed subject matter is not limited in this regard. In another particular embodiment, a time period of sense phase 205 may be more or less, depending on many factors such as bitline length and/or cell current (lithography dependant) and claimed subject matter is not limited in this regard. Accordingly, although bitline precharge phase 207 is approximately 2.5 microseconds in FIG. 2 such a precharge phase may vary as well. According to a particular embodiment, time periods for sensing phase 205 and precharge phase 207 may range depending on a variety of factors such as design tradeoffs and/or technology attributes and claimed subject matter is not limited in this regard.

In a particular embodiment, sensing element 100 (See FIG. 1) may be capable of sensing a variety of voltages and claimed subject matter is not limited in this regard. According to a particular embodiment, sensing may be done by applying a gate voltage to a memory cell to trip a sense amplifier. A gate voltage may be applied to the memory cell and a bias voltage applied to the drain. The cell current may be a function of the gate voltage and the cell threshold voltage. The trip point of the sense amplifier in FIG. 2 is 63 nanoamps when the applied gate voltage is equal to the cell threshold voltage. Thus sensing may be a comparison of the cell voltage with the memory cell threshold voltage. If the cell current "trips" the sense amplifier, a "1" is sensed, if it does not, a "0" is sensed. Therefore to determine a memory cell state, in a one bit per cell case, there may be one sense operation, for a two bit per cell case there may be three compares, for a three bit per cell case there may be seven compares and so on. In FIG. 2, the sense amplifier may trip at about 63 nanoamps and a threshold voltage may range from about 0V to 4V, however, this is merely an example of a sense amplifier trip point and threshold voltage range and claimed subject matter is not limited in this regard.

FIG. 3 is a block diagram illustrating a particular embodiment of process 300 for sensing one or more states of a memory cell. Process 300 may begin at block 302 where precharging a bitline of the memory cell to a predetermined amount may take place. In a particular embodiment, the bitline may be charged to a charge corresponding to the memory cell current.

Process 300 may flow to block 304 where a first and second current mirror to mirror first and second current references may be enabled. In a particular embodiment, a second current mirror may enable a cascade device coupled to the precharged bitline to maintain the bitline voltage. At block 304 a NAND string may also be enabled.

Process 300 may flow to block 306 where sensing of a voltage of a memory cell may begin. In a particular embodiment, if a memory cell current is equal to the difference between a first current reference and a second current reference, a sensed voltage at block 306 may be equal to about half of a Vreg. In a particular embodiment, if the memory cell current is higher than the difference between the first current reference and the second current reference a sensed voltage may swing low. According to a particular embodiment, if the memory cell current is lower than the difference between the first current reference and the second current reference the sensed voltage may swing high. In a particular embodiment, 'high' may be Vreg and 'low' may be ground. According to a particular embodiment, process 300 may flow to block 308 where a state of a memory cell may be detected based at least in part on a sensed voltage of a memory cell.

While certain features of claimed subject matter have been illustrated as described herein, many modifications, substitutions, changes and equivalents will now occur to those skilled in the art. It is, therefore, to be understood that the appended claims are intended to cover all such embodiments and changes as fall within the spirit of claimed subject matter.

What is claimed is:

1. An apparatus for determining one or more memory cell states in a memory device, comprising:
   a first memory cell coupled to a first bitline; and
   a first sensing element coupled to the first bitline, the first sensing element operable to sense a voltage corresponding to a state of the first memory cell wherein the sensed voltage is independent of a bitline voltage discharge over time of the first memory cell,
   the first sensing element comprising;
      a first reference current circuit comprising a first transistor;
      a second reference current circuit comprising a second transistor;
      a first sensing circuit coupled to the first reference current circuit and the second reference current circuit, wherein the first sensing circuit comprises;
         a first current mirror comprising a third transistor operable to mirror a current of the first reference current circuit; and
         a second current mirror comprising a fourth transistor coupled to the first current mirror via the first bitline wherein the second current mirror is operable to mirror a current of the second reference current circuit.

2. The apparatus of claim 1, wherein the first memory cell comprises a plurality of states stored in a plurality of bits of the first memory cell wherein the plurality of states are associated with the sensed voltage.

3. The apparatus of claim 1, wherein the first transistor and the third transistor comprise a matched pair and wherein the second transistor and the fourth transistor comprise a matched pair.

4. The apparatus of claim 1, wherein the first sensing element further comprises a latch comprising a trip point defined by the equation:

$$Icell = Ifref - Isref$$

wherein Icell is the memory cell current, Ifref is the current of the first reference current circuit and Isref is the current of the second reference current circuit and wherein Ifref corresponds to the sensed voltage.

5. The apparatus of claim 1, further comprising;
   a cascade device coupled to the first bitline operable to pre-charge the first bitline to a predetermined voltage; and
   a clamp coupled to the cascade device operable to maintain saturation of the cascade device during sensing of a first memory cell voltage.

6. The apparatus of claim 5, wherein the cascade device comprises a first transistor, and
   wherein the clamp comprises a second transistor.

7. The apparatus of claim 3, further comprising;
   a second memory cell coupled to the first memory cell via a wordline and adjacent to the first memory cell, the second memory cell comprising a second bitline; and
   a second sensing element wherein the second sensing element is operable to sense a second memory cell voltage wherein the second sensed voltage is independent of a bitline voltage discharge over time of the second memory cell.

8. The apparatus of claim 7, wherein the first memory cell voltage and the second memory cell voltage are sensed during a sensing period.

9. The apparatus of claim 7, further comprising;
   the second sensing circuit coupled to the first reference current circuit and the second reference current circuit;
   the second sensing circuit comprising;
      a third current mirror comprising a fifth transistor operable to mirror the current of the first reference current circuit; and
      a fourth current mirror comprising a sixth transistor coupled to the third current mirror via the second bitline wherein the fourth current mirror is operable to mirror the current of the second reference current circuit; and
   wherein the first transistor and the fifth transistor are a matched pair and wherein the second transistor and the sixth transistor are a matched pair.

10. The apparatus of claim 1, further comprising a sample and hold circuit coupled to the first or second reference current circuit, or combinations thereof and further coupled to a capacitor wherein the sample and hold circuit is adapted to hold a voltage on the capacitor.

11. A method for detecting one or more memory cell states comprising;
   selecting a first current reference to correspond to a threshold voltage (Vt) of a memory cell during a sensing operation;
   precharging a bitline of the memory cell a predetermined amount wherein the bitline charge corresponds to a memory cell current;
   enabling a first current mirror to mirror the first current reference;
   enabling a second current mirror to mirror a second current reference;
   sensing a memory cell voltage; and
   detecting a state of the memory cell based at least in part on the sensed voltage of the memory cell.

12. The method of claim 11 wherein if the memory cell current is equal to the difference between the first current reference and the second current reference the sensed voltage is equal to about half of a Vreg.

13. The method of claim 12 wherein if the memory cell current is higher than the difference between the first current reference and the second current reference the sensed voltage will swing low.

14. The method of claim 12 wherein the if the memory cell current is lower than the difference between the first current reference and the second current reference the sensed voltage will swing high.

15. An apparatus, comprising:
a first memory cell coupled to a first bitline; and
a first sensing element coupled to the first bitline, the first sensing element being operable to sense a voltage corresponding to a state of the first memory cell, and the sensed voltage being independent of a bitline voltage discharge over time of the first memory cell;
a cascade device coupled to the first bitline operable to pre-charge the first bitline to a predetermined voltage; and
a clamp coupled to the cascade device operable to maintain saturation of the cascade device during sensing of a first memory cell voltage.

16. The apparatus of claim 15, wherein the first memory cell comprises a plurality of states stored in a plurality of bits of the first memory cell, and
wherein the plurality of states are associated with the sensed voltage.

17. The apparatus of claim 15, wherein the cascade device comprises a first transistor, and
wherein the clamp comprises a second transistor.

18. An apparatus, comprising:
a first memory cell coupled to a first bitline; and
a first sensing element coupled to the first bitline, the first sensing element being operable to sense a voltage corresponding to a state of the first memory cell, and the sensed voltage being independent of a bitline voltage discharge over time of the first memory cell; and
a sample and hold circuit coupled to the first or second reference current circuit, or combinations thereof and further coupled to a capacitor, the sample and hold circuit being adapted to hold a voltage on the capacitor.

19. The apparatus of claim 18, wherein the first memory cell comprises a plurality of states stored in a plurality of bits of the first memory cell, and
wherein the plurality of states are associated with the sensed voltage.

* * * * *